(12) United States Patent
Shah et al.

(10) Patent No.: US 7,944,197 B2
(45) Date of Patent: May 17, 2011

(54) CLAMP METER WITH ROTARY MECHANISM FOR CLAMP JAWS

(75) Inventors: Tushar Gajkumar Shah, Nashik (IN); Kuldeep Himmatrao Shahane, Nashik (IN); Amol Ashokrao Deshmukh, Nashik (IN)

(73) Assignee: Rishabh Instruments Private Limited, Nashik, Maharashtra State (IN)

( * ) Notice: Subject to any disclaimer, the term of this patent is extended or adjusted under 35 U.S.C. 154(b) by 0 days.

(21) Appl. No.: 12/598,983

(22) PCT Filed: May 13, 2008

(86) PCT No.: PCT/IN2008/000295
§ 371 (c)(1),
(2), (4) Date: Nov. 5, 2009

(87) PCT Pub. No.: WO2009/004646
PCT Pub. Date: Jan. 8, 2009

(65) Prior Publication Data
US 2010/0134094 A1    Jun. 3, 2010

(30) Foreign Application Priority Data

May 18, 2007    (IN) .......................... 930/MUM/2007

(51) Int. Cl.
*G01R 1/38*    (2006.01)
*G01R 11/57*    (2006.01)
*G01R 15/00*    (2006.01)
*G01R 15/08*    (2006.01)

(52) U.S. Cl. ....................................................... 324/115
(58) Field of Classification Search .................. 324/126, 324/127, 99 D, 115, 121 R, 96
See application file for complete search history.

(56) References Cited

U.S. PATENT DOCUMENTS

| 5,610,512 A * | 3/1997 | Selcuk ........................... 324/127 |
| 5,924,816 A | 7/1999 | Schuele |
| 6,456,060 B1 | 9/2002 | Wiesemann |
| 2002/0050117 A1 | 5/2002 | Dasher et al. |

FOREIGN PATENT DOCUMENTS

| IN | 930/MUM/2007 | 3/2009 |
| WO | PCT/IN2008/000295 | 1/2009 |

* cited by examiner

*Primary Examiner* — Roberto Velez

(57) ABSTRACT

The present invention provides a clamp meter with clamp jaws whose position is adjustable in different planes with respect to the plane of the main body of the clamp meter at various fixed angles, thereby helping the user to measure the current in the conductors which are disposed in tight physical spaces such as an electrical cabinet or electrical panel, or placed in awkward positions such as overhead locations. The present invention allows the user to operate the instrument and also read the display in all positions of the clamp jaws.

14 Claims, 9 Drawing Sheets

CLAMP METER WITH ROTARY MECHANISM FOR CLAMP JAWS

CROSS REFERENCE TO RELATED APPLICATIONS

This application is a 371 National Stage entry of PCT/IN2008/000295, filed on May 13, 2008, which claims priority to Indian Patent Application Number 930/MUM/2007, filed on May 18, 2007.

FIELD OF INVENTION

This invention relates generally to electrical and electronic test and measuring instruments for measuring electrical current and particularly relates to multi meters that include clamp meters for the electrical current measurement.

BACKGROUND OF THE INVENTION

Multi meters are used to measure a variety of electrical parameters such as AC voltage, AC current, DC voltage, DC current, and resistance. Clamp meters are a type of multi meters with a current sensing clamp.

Clamp meters are designed to measure current without breaking the current path and typically have two clamp jaws which open and close at a fixed position with respect to the body and display of the clamp meter. Current is measured by opening the jaws to close them around the conductor element carrying the current. The clamps are provided with electrical coils inside them. In the closed position of the clamp jaws, the current flowing in the conductor element (such as a bus bar or a cable), of an electrical circuit magnetically induces a current in the coils. This current is proportional to the current flowing through the conductor element. For measuring the electrical current, there does not need to be an electrical contact between the conductor element and the clamps.

The conventional clamp meters have a rectangular housing designed to be held in one hand. A pair of clamp jaws extends from one end of the housing. The jaws are situated in a fixed plane that is generally parallel to the plane of the front face of the housing. The meter's display is normally also disposed in the front face of the housing. Refer U.S. Pat. Nos. 6,975,104 and 6,456,060.

A drawback of the existing clamp meters is they are awkward to use under many situations where the conductor elements that need monitoring are tightly placed in congested physical configurations. Under these circumstances, when the clamp jaws are placed around a conductor, the display and the keys might be orientated in a position which makes reading the display and operation of keys very difficult if not impossible. This makes the measurement and online monitoring processes cumbersome. Conductors that are either situated overhead or disposed in tight physical spaces such as an electrical cabinet are examples of such situations.

Therefore, a need exists for an improved clamp meter where the clamp jaws can be easily adjusted so that the operation of the clamp meter and reading of the display unit becomes easy.

OBJECTS & ADVANTAGES OF THE INVENTION

Accordingly, one of the objects of the present invention is to provide a clamp meter having rotary clamps which can be rotated at various angles in order to access conductor elements such as bus bars, cables or other conductors that are placed in physically awkward or relatively inaccessible positions for measuring current.

Another object of the present invention is to provide clamp meter which can be rotated to easily facilitate the measurement of the current in conductor elements such as bus bars, cables or other conductors that are placed in physically awkward or relatively inaccessible positions, by making the clamp meter display visible through rotation of the clamp jaws.

Yet another object of the present invention is to provide a clamp meter whose push buttons & function selection switch are easy to operate in the field situations.

A further objective of the present invention is to provide a clamp meter that is split so that it has a measuring assembly that is separate from its control assembly.

SUMMARY OF THE INVENTION

Figure 1:
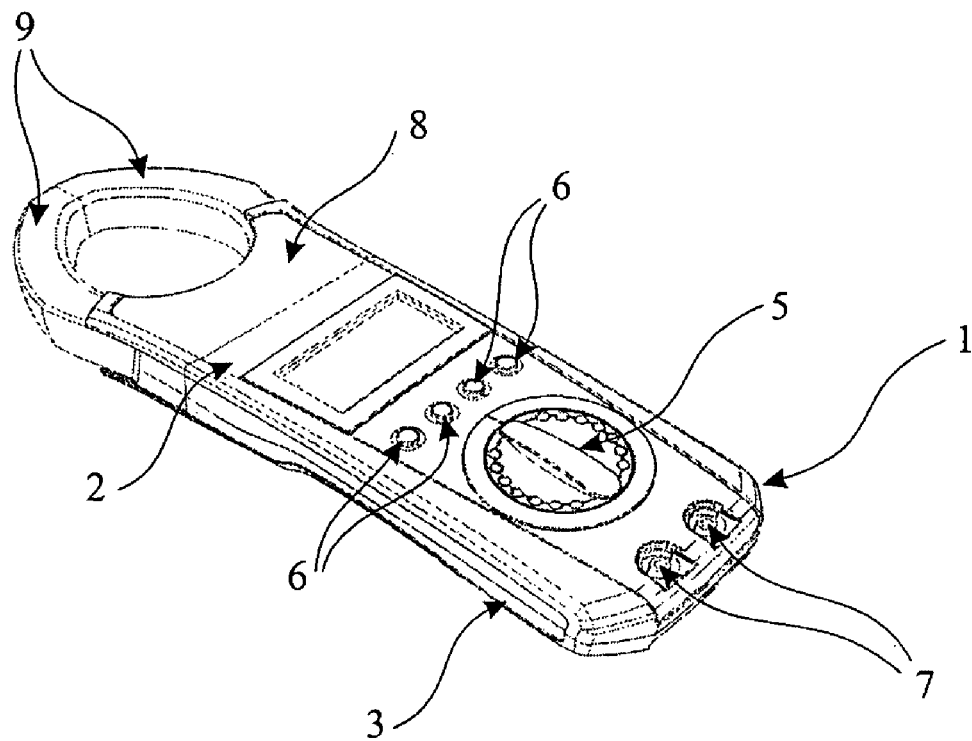
FIG. 1 is an isometric view taken from the top showing a clamp meter with rotary clamps of the present invention with clamps at normal position of the present invention.

The present invention provides a clamp meter with clamp jaws whose position is adjustable in different planes at various fixed angles, thereby helping the user to measure the current in the conductors which are disposed in tight physical spaces such as an electrical cabinet or electrical panel, or placed in awkward positions such as overhead locations. The present invention allows the user to operate the instrument and also read the display in all clamp positions.

LIST OF PARTS

Main body (1)
Cover Housing (2)
Base Housing (3)
Display screen (4)
Function selection switch (5)
Set of push buttons (6)
Two input terminals (7)
Clamp housing (8)
Clamp jaws (9)
Pivot sleeve (10)

-continued

Conductor (C)
Pivot screw (11)
Pin (12)
Trigger (13), Pusher (14)
Spherical end of the Pusher (14a)
Compression springs (15)
Disc (16)
Protrusions (17)
Grooves (18)
Locking springs (19)
Ball (20); Loop (21)
Alternative to spherical end (14b)

DETAILED DESCRIPTION OF THE INVENTION

FIG. 1, shows the clamp meter of the present invention, with clamps at normal position.

The process for measurement of current for typical clamp meter is as below:
  a. Selecting measuring functions like AC Voltage, DC Voltage, Resistance, Diode, AC Current through a rotary function selection switch
  b. Accessing the conductor
  c. Adjusting the position of the clamp jaws around the conductor
  d. Through the use of the push buttons: switching ON and OFF the Digital Clamp meter; selecting optional additional functions like Auto Ranging, Manual Ranging, Minimum Reading, Maximum Reading, Data Hold; and selecting alternative functions like Frequency, continuity.
  e. Taking the reading on the display.

Figure 3:
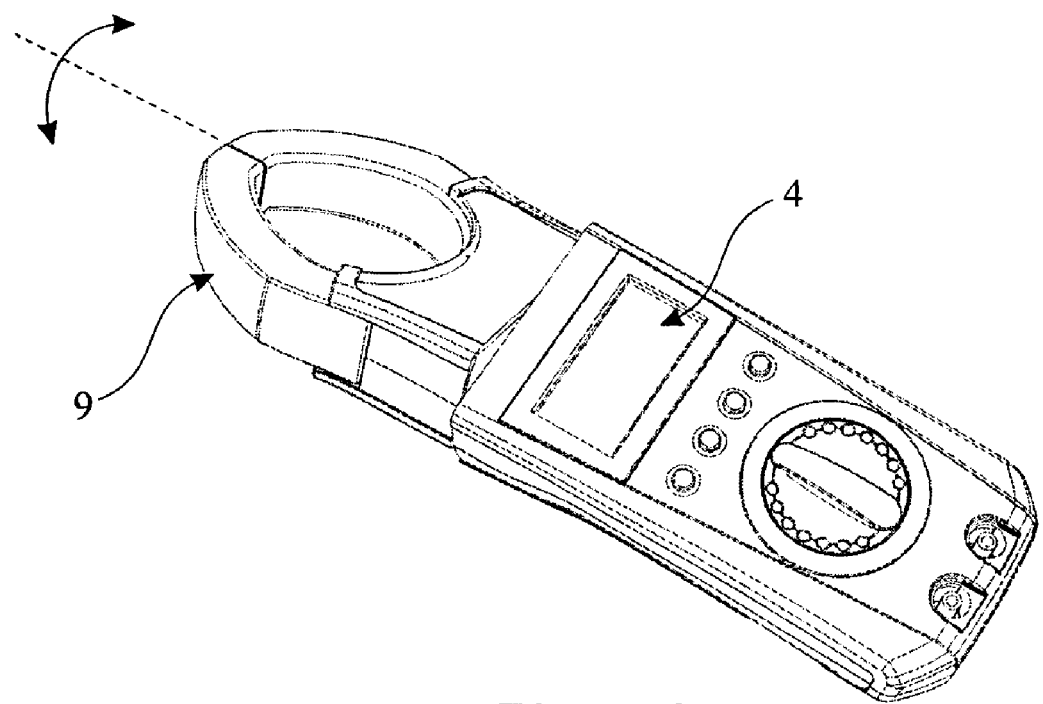
FIG. 3 shows clamp meter with the clamps in a rotated position.
Figure 4:
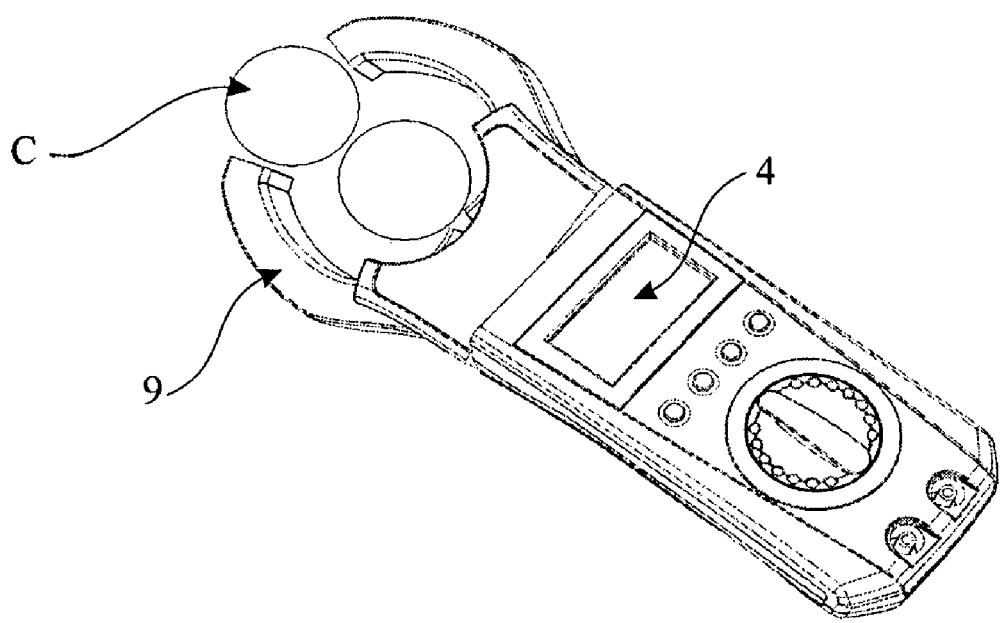
FIG. 4 shows the clamp mechanism in a measuring configuration with the clamps in rotated position.

The clamp meter of the present invention allows performing of all of these functions as shown in FIG. 3. One of the key features of the present invention is that any or all of the above operations can be performed in any of the rotated positions of the clamps.

Figure 2:
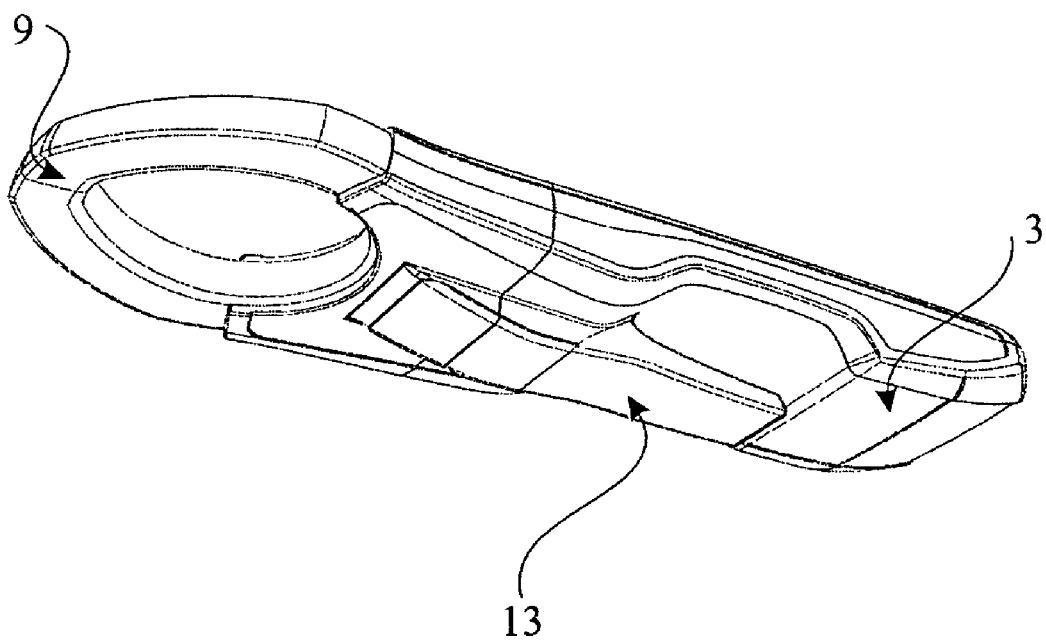
FIG. 2 is an isometric view taken from the bottom showing a clamp meter with rotary clamps of the present invention with clamps at normal position of the present invention.

Referring to FIGS. 1 and 2, the main body (1) of the clamp meter of the present invention is made of a cover housing (2) and a base housing (3), the two housings enclosing the measurement circuitry of the clamp meter. A display screen (4), a function selection switch (5), and a set of push buttons (6) to select testing parameters are housed within the two housings and electrically connected to the measurement circuitry. Two input terminals (7) are also provided for connecting the test leads.

A clamp housing (8) houses clamp jaws (9). Clamp jaws (9) are connected to the clamp housing (8) through an arrangement comprising a pivot sleeve (10) and pivot screw (11) for each of the clamps. The two jaws (9) are connected to each other through a central hinge arrangement wherein each or the jaws have a loop (21), the loops for both clamp jaws (9) being positioned together axially, through which a pin (12), which is made of metal or any other suitable material such as hard plastic, hard rubber, or wood, passes to form a central hinge arrangement.

Figure 5:
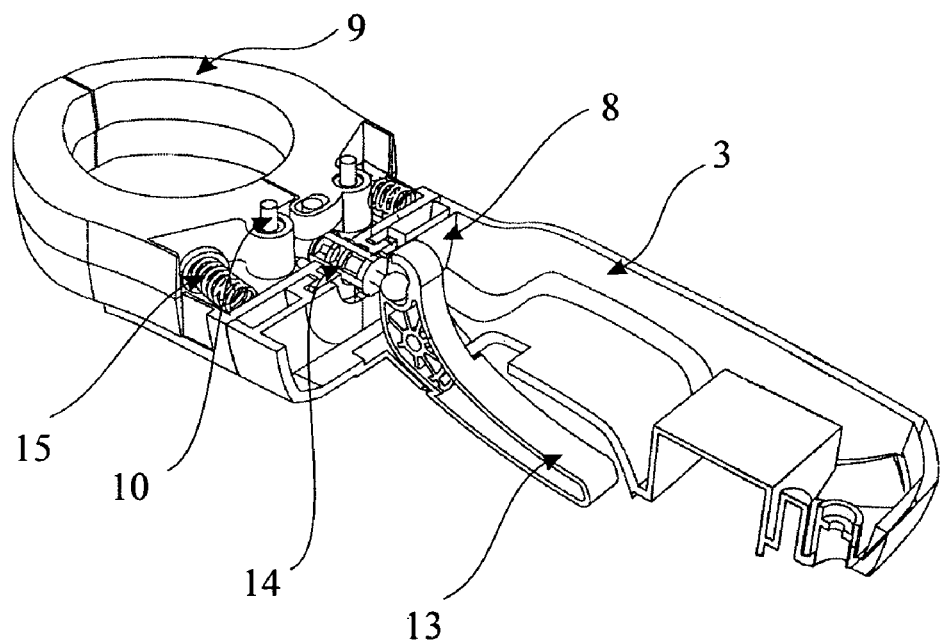
FIG. 5 shows the mechanism for opening and rotating the clamp jaws.

Referring to FIG. 5, a trigger (13) is used for opening and closing the clamp jaws (9). When pressed, the hinge end of the trigger (13) pushes the spherical end (14a), also referred to as the trigger-end, of a pusher (14). The pin (12) is fixedly attached to the other end of the pusher (14). When the trigger (13) is pressed, the pusher (14) gets pushed along its axis, thereby moving the pin (12) in the same direction. The pin (12), through the central hinge arrangement, opens the clamp jaws (9) by rotating them in their own plane. This is made possible by each jaw rotating around its own pivot sleeve (10), thereby opening them around the pin (12) as the pivot point. In their open position, the clamp jaws (9) press against the compression springs (15). Upon the release of the trigger (13), the compression springs (15) push the clamp jaws (9) back into their closed position, once again by each clamp jaw rotating about the pin (12) as the pivot point.

Figure 9:
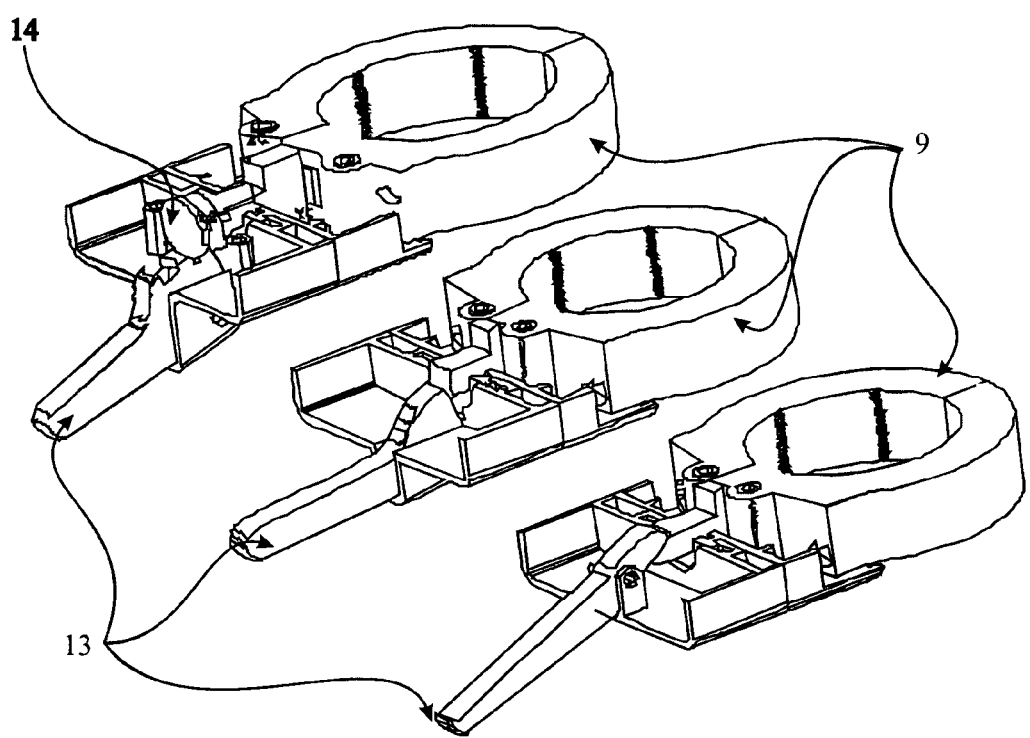
FIGS. 9 and 10 show the various alternatives to the spherical end of the pusher.
Figure 10:
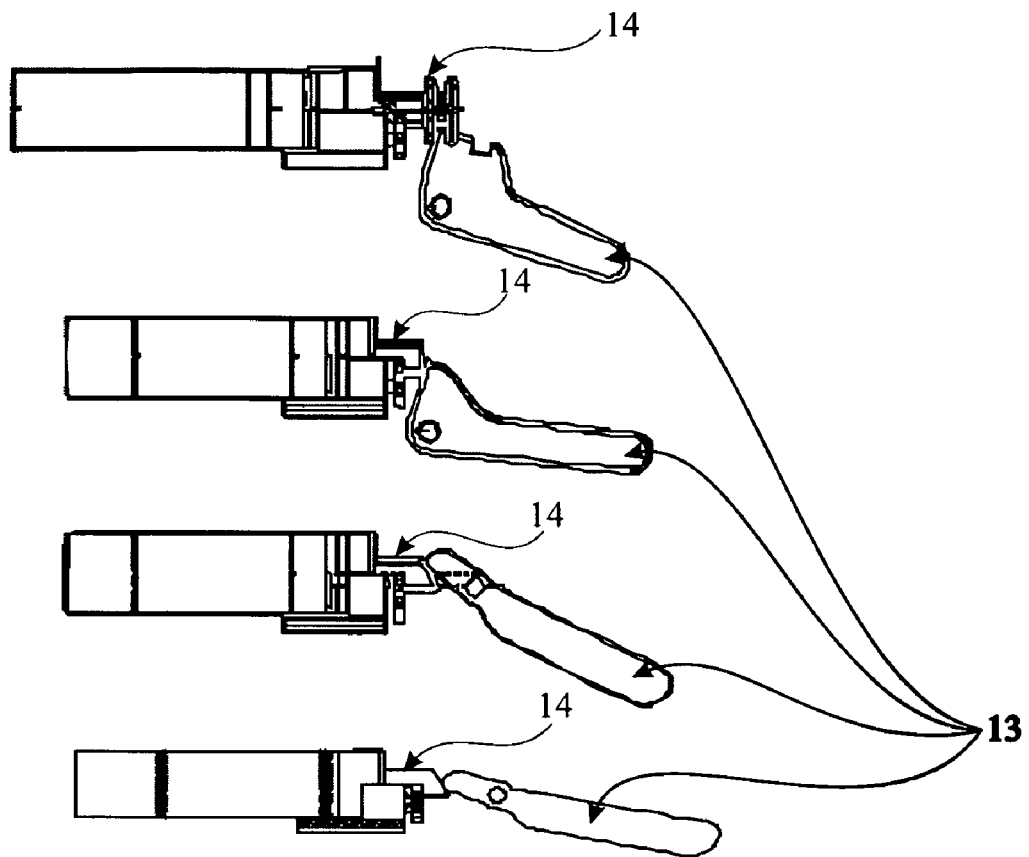

As shown in FIGS. 9 and 10, the trigger-end of the pusher (14) that is pushed by the trigger (13), and the hinge end of the trigger (13) can be of any shape other than spherical, and any other type than solid, said shape selected from a group comprising wedge, multiple wedge, or any other curvilinear shape or a combination thereof, so that the trigger pushes the pusher effectively without any play.

The clamp jaws (9) contain electrical coils within themselves which are connected electrically to the measurement circuitry for measuring current of a conductor. The measurements are displayed on the display screen (4).

In conventional clamp meters, the clamp jaws (9) and the main body (1) of the clamp meter are in the fixed same plane. As shown in FIG. 3, one of the key features of the present invention a rotary mechanism with the help of which the clamp jaws (9) together can rotate in different planes with respect to the plane of the main body (1) of the clamp meter, which allows the operator of the clamp meter to access congested areas of measurement. The clamp jaws (9) together rotate about the longitudinal axis of the pusher (14). The novel rotary mechanism also makes this rotation possible in either the closed or open positions of the clamp jaws (9).

In an embodiment of the present invention, the clamp jaws (9) may be fixedly positioned in a plane other than that of the main body (1) of the clamp meter; in which situation, the product of the present invention is made optionally without the rotary mechanism.

Figure 6:
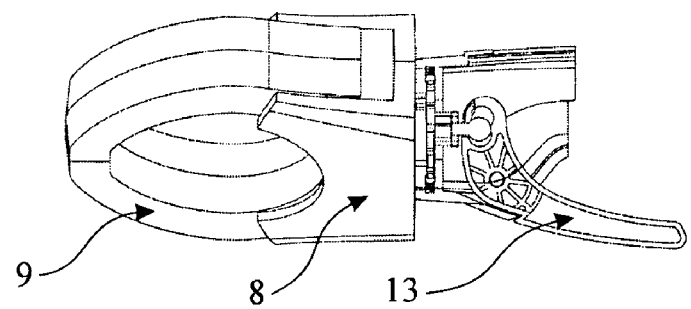
FIG. 6 shows several views of the rotary mechanism.
Figure 6:
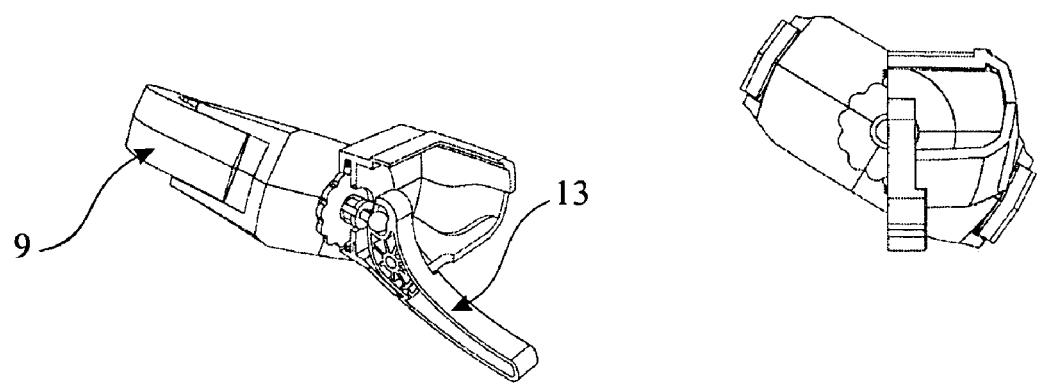
Figure 7:
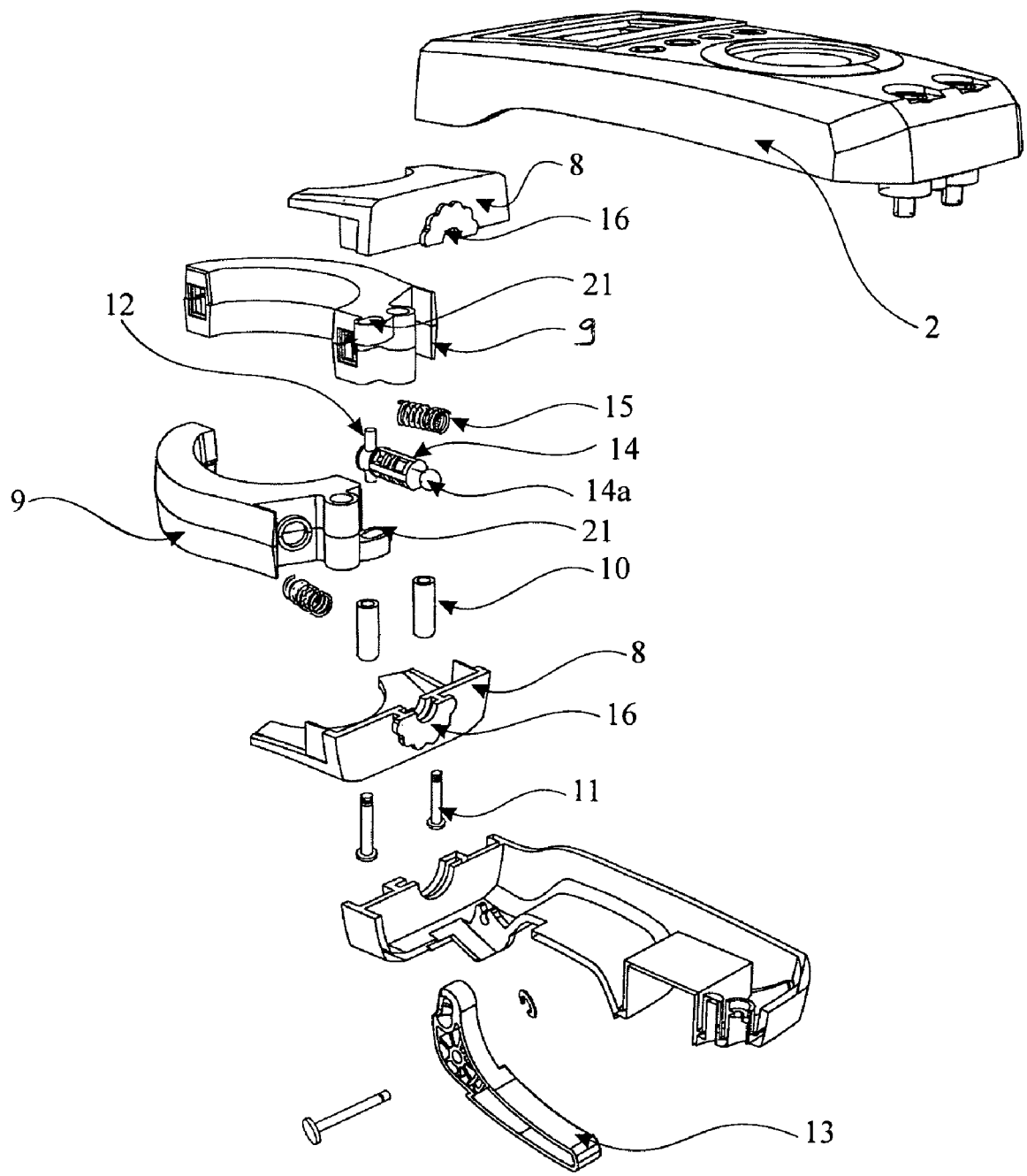
FIG. 7 shows exploded view of the rotary and opening mechanisms.
Figure 8:
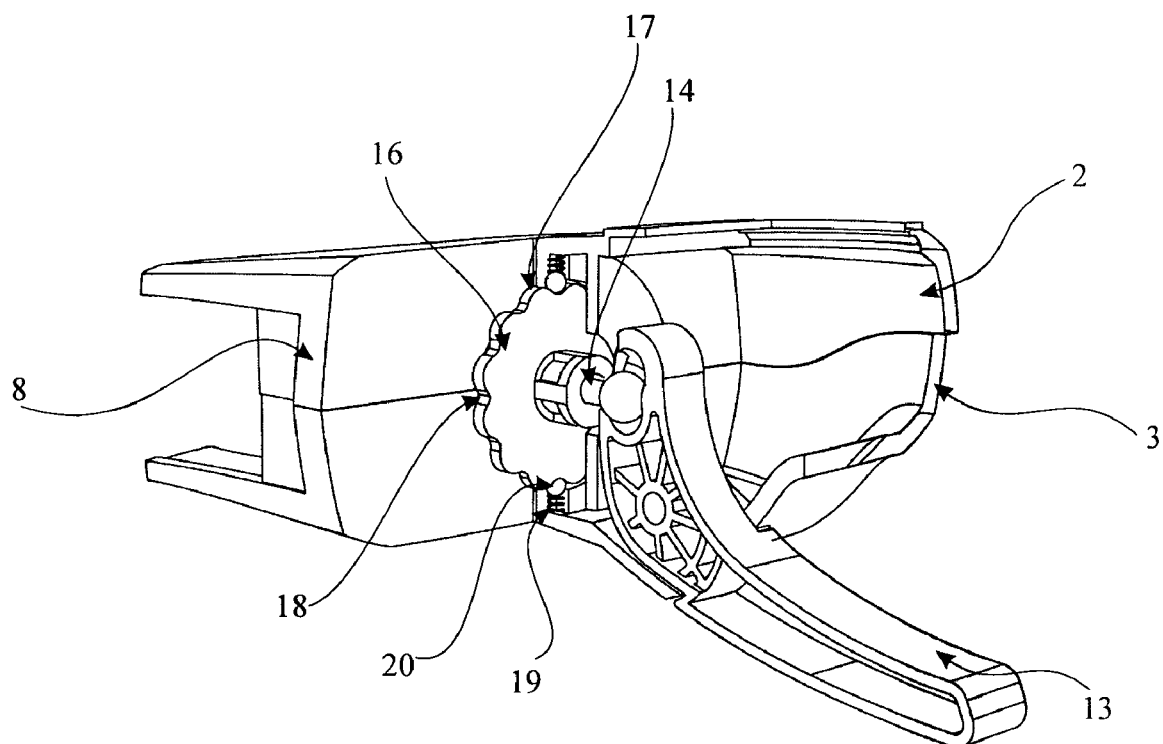
FIG. 8 shows the ball catch arrangements of the clamp rotary mechanism for locking the position of clamp jaws at different angle.

The novel rotary mechanism is now described. The various parts of the rotary mechanism are shown in FIGS. 6, 7, and 8. A disk is formed integrally with the clamp housing (8) as shown in FIG. 8. The periphery of the disk is so shaped that it forms alternate protrusions (17) and grooves (18) in the plane of the disk.

As shown in FIG. 8, in the preferred embodiment of the present invention, two balls and catch arrangements are provided on diametrically opposite sides of the disk. Locking springs (19) are provided along with each ball (20) to ensure that the ball (20) is secured in a groove when not under application of a rotational force. Instead of locking springs (19), any arrangement such as elastic material such as rubber or special polymers may be used for the purpose. Upon applying a rotational force to the clamp assembly, the ball (20) of the ball catch arrangement gets pushed against the nearest protrusion and moves along its profile. Once it clears the hump of the protrusion, it gets securely positioned in the next groove, thereby bringing the clamp assembly into a rotated position with respect to the main body (1) of the clamp meter. Many rotational positions are possible, a single position corresponding to each groove of the disk. For continued rotation of the clamp jaws (9), the rotary force is applied continually, whereby the ball (20) keeps clearing the grooves (18) and humps until the clamp housing (8) has rotated to the desired position. At this time, the application of the rotary force is stopped and the clamp jaws (9) get secured in a rotated position.

In an embodiment of the present invention, the two ball and catch arrangements may be placed anywhere along the periphery of the disk, and not necessarily at the diametrically opposite positions.

In a further embodiment of the present invention, the number of ball and catch arrangements may be one or greater than two.

The size of the groves and the protrusions (17) is determined depending on the desired minimum angle through which the clamp jaws (9) need to be rotated. It is also possible to use an arrangement whereby continuous rotation of the main body (1) of the meter is possible. This is effected by deployment mechanisms including provision of ball bearings so that the clamp jaws (9) can be effectively secured at any angle with respect to the main body (1) of the material.

The profile of the grooves (18) and the protrusion may be circular, elliptical, or any other suitable shape that will not impede the movement of the ball (20) along the profile of the disk.

It is evident from the foregoing discussion, and as indicated by movement arrows in FIG. 3 that the novel rotary mechanism disclosed in the present invention ensures that the clamp housing (8) can freely rotate in clockwise and anticlockwise direction with respect to the main body (1) of the clamp meter. It is thus possible to maintain the clamp housing (8) at different fixed angles in order to access conductors that are located in awkward positions or that are inaccessible with the existing clamp meters. It is also evident that all functions of a typical clamp meters are possible to be carried out with the rotary clamp meter of the present invention, in any rotated position of the clamp jaws (9).

The present invention provides another major advantage of over the present clamp meters. The electricians or other personnel, who would have otherwise ignored to take measurements of conductors that are located in awkward or inaccessible locations, would now take measurements of such conductors. This makes it possible to detect conductors that are carrying hazardous current or operating under 'out-of-the-safety-limit' parameter values of voltage, current etc. This in turn serves as a great preventive step against future possible hazards leading to damage to or loss of property resulting from electric failures, fires caused by overheated conductors etc.

In another embodiment of the present invention, the trigger (13) may be placed at any positions such as side of the clamp meter, or any other position from where clamp jaws (9) can be appropriately worked, and not symmetrically at the centre of the main body (1) of the clamp meter.

In yet another embodiment of the present invention, the disc (16) may be made from any electrically non-conducting hard or semi-hard material.

In a still further embodiment of the present invention, the disc (16) may not be formed integrally with the clamp housing (8). The disc (16) may be manufactured separately and attached fixedly to the clamp housing (8) by any means of attachment such as gluing, heat and pressure, welding, etc.

In a still further embodiment of the present invention the peripheral profile of the disc (16) may be such that allows easy movement of the ball (20) into the grooves (18) and over the humps under the application of the rotating force, and also positions the ball (20) into the grooves (18) securely when not under the application of the rotating force.

Figure 11:
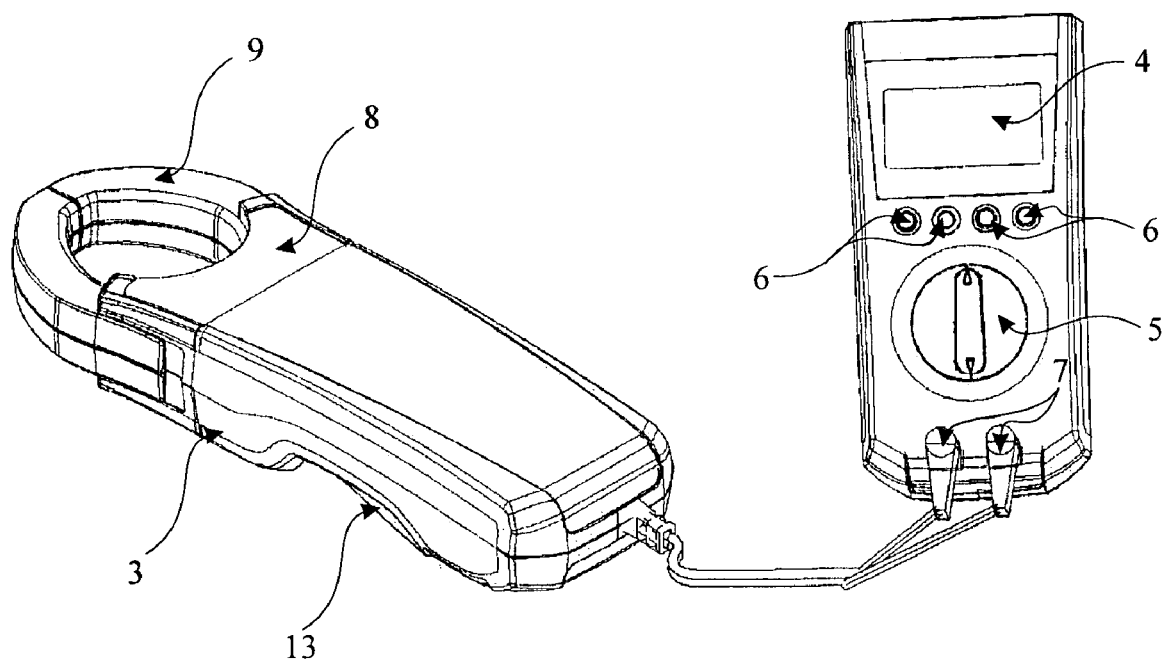
FIGS. 11 and 12 show the split arrangement for the product of the present invention
Figure 12:
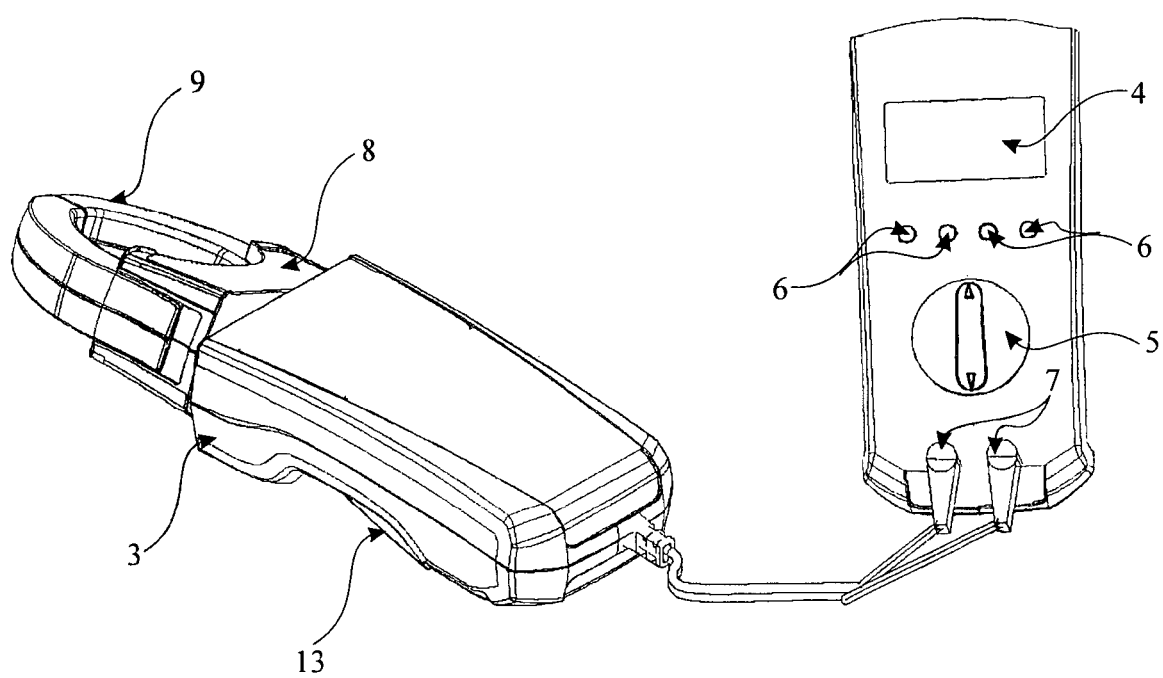

In yet another embodiment, and as shown in FIGS. 11 and 12, the trigger (13) and the clamp jaws (9) may be housed together in a jaw assembly (or a measuring assembly) that is separate from the control assembly containing the display, function selection switch (5), parameter measuring devices, etc. In this embodiment, the jaw assembly is connected wirelessly or with a physical connection to the measurement assembly. The jaw assembly comprises jaws that are rotatable with respect to the main body (1) of the jaw assembly or fixed at any angle therewith.

In a still further embodiment of the present invention, the clamp jaws (9) may be locked in a particular planar position with respect to the plane of the main body (1) of the clamp meter.

In yet another embodiment of the present invention, the material used for the trigger, the clamp jaws, the cover and base housings may be any material selected from the group comprising metals, alloys, plastic, rubber, or any other such suitable material, or a combination thereof.

It is clear from the foregoing discussion that the present invention comprises the following items:

1. A novel clamp meter with rotary mechanism for clamp jaws comprising a main body that is made up of
   a. a cover housing and a base housing, the two housings enclosing the measurement circuitry of the clamp meter;
   b. a display screen, a function selection switch, and a set of push buttons to select testing parameters are housed within the housings and electrically connected to said measurement circuitry,
   c. two input terminals,
   d. a clamp housing that houses a pair of clamp jaws, each of said clamp jaws containing electrical coils, said coils being electrically connected to said circuitry; said clamp jaws being connected to said clamp housing through an arrangement comprising a pivot sleeve and pivot screw for each of the clamps, and the two jaws from said pair of clamp jaws being connected to each other through a central hinge arrangement wherein each of the said jaws have a loop that are positioned axially, through which a pin, which is made of metal or any other suitable material such as hard plastic, hard rubber, or wood, passes to form the hinge arrangement,
   e. a trigger that is used for opening and closing said clamp jaws, wherein when pressed, the trigger pushes the trigger-end of a pusher, said pin being fixedly attached to the other end of said pusher such that when said trigger is operated, said pusher gets pushed along its axis, thereby moving said pin in the same direction, and wherein said pin, through the central hinge arrangement, makes the clamp jaws rotate in their own plane, thereby opening them around the pin,
   f. a compression spring for each of said jaws, wherein said compression springs are so located that said clamp jaws, in their open position, press against said compression springs, and whereby, upon the release of said trigger, said compression springs push said clamp jaws back into their closed position,
   g. a rotary mechanism that allows rotation of said clamp jaws together around the longitudinal axis of said pusher, wherein said novel rotary mechanism comprises:
      i. a disk that is formed integrally with the clamp housing, wherein the periphery of the disk is so shaped that it forms alternate protrusions and grooves in the plane of the disk,
      ii. ball and catch arrangements, at least one in number, preferably two, that are provided on diametrically opposite sides of the disk, wherein each ball is provided with a locking spring such said ball is secured in a groove when not under application of a rotational force while turning said pair of clamp jaws.
2. A novel clamp meter with rotary mechanism as described in item 1, wherein said trigger may be placed at any positions such as side of the clamp meter, or any other position from where clamp jaws can be appropriately worked.

3. A novel clamp meter with rotary mechanism as described in items 1 and 2, wherein said disc is made from any electrically non conducting material, preferably hard or semi-hard.

4. A novel clamp meter with rotary mechanism as described in items 1 to 3, wherein said disc is not formed integrally with the clamp housing, that is said disc is manufactured separately and attached fixedly to the clamp housing by any means of attachment selected from a group comprising gluing, heat and pressure, welding, etc., or any combination thereof.

5. A novel clamp meter with rotary mechanism as described in items 1 to 4. wherein the peripheral profile of said disc may be such that allows easy movement of said ball into any of said grooves and over any of said humps under the application of a rotating force, and also positions said ball into any of said grooves securely when not under the application of the rotating force.

6. A novel clamp meter with rotary mechanism as described in items 1 to 5 wherein said ball and catch arrangements may be single or more than two.

7. A novel clamp meter with rotary mechanism as described in items 1 to 6 wherein, in the case two ball and catch arrangements are used, said two ball and catch arrangements may be placed anywhere along the periphery of said disk.

8. A novel clamp meter with rotary mechanism as described in items 1 to 8, wherein parts contained in items d, e, f, and g of claim 1 are be housed together in a jaw assembly that is separate from the measurement assembly containing the parts contained in items a, b, and c of claim 1.

9. A novel clamp meter with rotary mechanism as described in items 1 to 8, wherein said jaw assembly is connected wirelessly or with a physical connection to the measurement assembly.

10. A novel clamp meter with rotary mechanism as described in items 1 to 9, wherein said ball and catch arrangements are replaced with any other suitable mechanisms incorporating mechanical rotary bearings, or a gear train.

11. A novel clamp meter with rotary mechanism as described in items 1 to 10, wherein said electrical coils are replaced with any sensors, and further wherein said electrical coils or said sensors are magnetically connected to said circuitry.

12. A novel clamp meter with rotary mechanism as described in items 1 to 11, wherein said trigger-end of said pusher and said hinge end of said trigger may be of any shape selected from a group comprising wedge shaped, split wedges, flat or any curvilinear surface.

13. A novel clamp meter with rotary mechanism as described in items 1 to 12, wherein instead of each of said compression springs and instead of each of said locking springs, a material with elastic properties is used said material being used in shape of a solid or hollow cylinder or any other suitable shape, and wherein said material is selected from a group comprising rubber, polymer, or any combination thereof.

14. A novel clamp meter with rotary mechanism as described in items 1 to 13, wherein the material used for the trigger, the clamp jaws, the cover and base housings may be any material selected from the group comprising metals, alloys, plastic, rubber, or any other such suitable material, or a combination thereof.

15. A novel clamp meter with rotary mechanism substantially as herein described and illustrated in accompanying drawings.

Although the invention has been described with reference to certain embodiments, the invention is not limited to those embodiments alone. Alterations to the embodiments described are possible without departing from the spirit of the invention. However, the apparatus described above is intended to be illustrative only, and the novel characteristics of the invention may be incorporated in other structural forms without departing from the scope of the invention.

The invention claimed is:

1. A novel clamp meter with rotary mechanism for clamp jaws comprising a main body that is made up of
    a) a cover housing and a base housing, the two housings enclosing a measurement circuitry of the clamp meter;
    b) a display screen, a function selection switch, and a set of push buttons to select testing parameters are housed within said cover and base housings and electrically connected to said measurement circuitry,
    c) two input terminals,
    d) a clamp housing that houses a pair of clamp jaws, each of said clamp jaws containing electrical coils, said coils being electrically connected to said circuitry; said clamp jaws being connected to said clamp housing through an arrangement comprising a pivot sleeve and pivot screw for each of the clamps, and the two jaws from said pair of clamp jaws being connected to each other through a central hinge arrangement wherein each of the said jaws have a loop that are positioned axially, through which a pin, which is made of metal or any other suitable material selected from a group of materials comprising hard plastic, hard rubber, and wood, passes to form the hinge arrangement,
    e) a trigger that is used for opening and closing said clamp jaws, wherein when pressed, the trigger pushes a trigger-end of a pusher, said pin being fixedly attached to a hinge-end of said pusher such that when said trigger is operated, said pusher gets pushed along a longitudinal axis, thereby moving said pin in the same direction, and wherein said pin, through the central hinge arrangement, makes the clamp jaws rotate in their own plane, thereby opening them around the pin,
    f) a compression spring for each of said jaws, wherein said compression springs are so located that said clamp jaws, in their open position, press against said compression springs, and whereby, upon the release of said trigger, said compression springs push said clamp jaws back into their closed position,
    g) a rotary mechanism that allows rotation of said clamp jaws together around the longitudinal axis of said pusher, wherein said rotary mechanism comprises:
        i) a disk that is formed integrally with said clamp housing, wherein a periphery of the disk is so shaped that it forms alternate protrusions and grooves in a plane of the disk, each of said protrusions having a hump, wherein said disk is made from any electrically non conducting material selected from a group of materials comprising hard or semi-hard materials,
        ii) ball and catch arrangements, at least one in number, that are provided peripherally on the disk, wherein each ball is provided with a locking spring such that said ball is secured in a groove when not under application of a rotational force while turning said pair of clamp jaws.

2. A novel clamp meter with a rotary mechanism as claimed in claim 1, wherein said trigger may be placed at a side of the clamp meter, or any other position from where clamp jaws can be appropriately worked.

3. A novel clamp meter with rotary mechanism as claimed in claim 2, wherein the profile of said periphery of said disc is such that allows easy movement of said ball into any of said grooves and over any of said humps under the application of a rotating force, and also positions said ball into any of said grooves securely when not under the application of the rotating force.

4. A novel clamp meter with rotary mechanism as claimed in claim 3 wherein two ball and catch arrangements are provided at any positions around said periphery of said disc.

5. A novel clamp meter with rotary mechanism as claimed in claim 4 wherein, said ball and catch arrangements are placed anywhere diametrically oppositely along said periphery of said disk.

6. A novel clamp meter with rotary mechanism as claimed in claim 5, wherein parts contained in items d), e), f), and g) are housed together in a jaw assembly that is separate from a measurement assembly containing the parts contained in items a), b), and c).

7. A novel clamp meter with rotary mechanism as claimed in claim 6, wherein said jaw assembly is connected wirelessly or with a physical connection to said measurement assembly.

8. A novel clamp meter with rotary mechanism as claimed in claim 7, wherein said trigger-end of said pusher and said hinge end of said trigger may be of any shape selected from a group comprising wedge shaped, split wedges, flat or any curvilinear surface.

9. A novel clamp meter with rotary mechanism as claimed in claim 8, wherein the material used for the trigger, the clamp jaws, the cover and base housings may be any material selected from the group comprising metals, alloys, plastic, rubber, or a combination thereof.

10. A novel clamp meter with rotary mechanism for clamp jaws comprising a main body that is made up of
   a) a cover housing and a base housing, the two housings enclosing a measurement circuitry of the clamp meter;
   b) a display screen, a function selection switch, and a set of push buttons to select testing parameters are housed within said cover and base housings and electrically connected to said measurement circuitry,
   c) two input terminals,
   d) a clamp housing that houses a pair of clamp jaws, each of said clamp jaws containing electrical coils, said coils being electrically connected to said circuitry; said clamp jaws being connected to said clamp housing through an arrangement comprising a pivot sleeve and pivot screw for each of the clamps, and the two jaws from said pair of clamp jaws being connected to each other through a central hinge arrangement wherein each of the said jaws have a loop that are positioned axially, through which a pin, which is made of metal or any other suitable material selected from a group of materials comprising hard plastic, hard rubber, and wood, passes to form the hinge arrangement,
   e) a trigger that is used for opening and closing said clamp jaws, wherein when pressed, the trigger pushes a trigger-end of a pusher, said pin being fixedly attached to a hinge-end of said pusher such that when said trigger is operated, said pusher gets pushed along a longitudinal axis, thereby moving said pin in the same direction, and wherein said pin, through the central hinge arrangement, makes the clamp jaws rotate in their own plane, thereby opening them around the pin,
   f) a compression spring for each of said jaws, wherein said compression springs are so located that said clamp jaws, in their open position, press against said compression springs, and whereby, upon the release of said trigger, said compression springs push said clamp jaws back into their closed position,
   g) a rotary mechanism that allows rotation of said clamp jaws together around the longitudinal axis of said pusher, wherein said rotary mechanism comprises:
      i) a disk that is manufactured separately and attached fixedly to said clamp housing by any means of attachment selected from a group comprising gluing, heating and pressurising, welding, and any combination thereof, wherein a periphery of the disk is so shaped that it forms alternate protrusions and grooves in a plane of the disk, each of said protrusions having a hump, wherein said disk is made from any electrically non conducting material selected from a group of materials comprising hard or semi-hard materials,
      ii) ball and catch arrangements, at least one in number, that are-provided peripherally on the disk, wherein each ball is provided with a locking spring such that said ball is secured in a groove when not under application of a rotational force while turning said pair of clamp jaws.

11. A novel clamp meter with rotary mechanism for clamp jaws as claimed in claim 10 wherein the profile of said periphery of said disc is such that allows easy movement of said ball into any of said grooves and over any of said humps under the application of a rotating force, and also positions said ball into any of said grooves securely when not under the application of the rotating force, and wherein ball and catch arrangements are provided at any positions around said periphery of said disc, and wherein parts contained in items d), e), f), and g) are housed together in a jaw assembly that is separate from a measurement assembly containing the parts contained in items a), b), and c), and wherein said jaw assembly is connected wirelessly or with a physical connection to said measurement assembly, and wherein said trigger-end of said pusher and said hinge end of said trigger may be of any shape selected from a group comprising wedge shaped, split wedges, flat or any curvilinear surface, and wherein the material used for the trigger, the clamp jaws, the cover and base housings may be any material selected from the group comprising metals, alloys, plastic, rubber, or a combination thereof.

12. A novel clamp meter with rotary mechanism for clamp jaws comprising a main body that is made up of
   a) a cover housing and a base housing, the two housings enclosing a measurement circuitry of the clamp meter;
   b) a display screen, a function selection switch, and a set of push buttons to select testing parameters are housed within said cover and base housings and electrically connected to said measurement circuitry,
   c) two input terminals,
   d) a clamp housing that houses a pair of clamp jaws, each of said clamp jaws containing at least one current detecting and measuring sensor, said sensor being electrically connected to said circuitry; said clamp jaws being connected to said clamp housing through an arrangement comprising a pivot sleeve and pivot screw for each of the clamps, and the two jaws from said pair of clamp jaws being connected to each other through a central hinge arrangement wherein each of the said jaws have a loop that are positioned axially, through which a pin, which is made of metal or any other suitable material selected from a group of materials comprising hard plastic, hard rubber, or wood, passes to form the hinge arrangement,
   e) a trigger that is used for opening and closing said clamp jaws, wherein when pressed, the trigger pushes a trigger-end of a pusher, said pin being fixedly attached to a hinge-end of said pusher such that when said trigger is operated, said pusher gets pushed along a longitudinal axis, thereby moving said pin in the same direction, and wherein said pin, through the central hinge arrangement, makes the clamp jaws rotate in their own plane, thereby opening them around the pin, f) an elastic element for each of said jaws, said elastic elements being in shape of a solid or hollow cylinder, and wherein material for said elastic elements is selected from a group comprising rubber, polymer, or any combination thereof, wherein said elastic elements are so located that said clamp jaws, in their open position, press against said elastic element, and whereby, upon the release of said trigger, said elastic elements push said clamp jaws back into their closed position, g) a rotary mechanism that allows rotation of said clamp jaws together around the longitudinal axis of said pusher, wherein said rotary mechanism comprises:
  i) a disk that is either formed integrally with said clamp housing or manufactured separately and attached fixedly to said clamp housing by any means of attachment selected from a group comprising gluing, heating and pressurising, welding, and any combination thereof, wherein a periphery of the disk is so shaped that it forms alternate protrusions and grooves in a plane of the disk, each of said protrusions having a hump, wherein said disk is made from any electrically non conducting material selected from a group of materials comprising hard or semi-hard materials,
  ii) an arrangement selected from a group comprising rotary bearings or a gear train so that the disk is secured in place when not under application of a rotational force while turning said pair of clamp jaws.

13. A novel clamp meter with rotary mechanism for clamp jaws as claimed in claim 12 wherein parts contained in items d), e), f), and g) are housed together in a jaw assembly that is separate from a measurement assembly containing the parts contained in items a), b), and c), and wherein said jaw assembly, is connected wirelessly or with a physical connection to the said measurement assembly, and wherein said trigger-end of said pusher and said hinge end of said trigger may be of any shape selected from a group comprising wedge shaped, split wedges, flat or any curvilinear surface, and wherein the material used for the trigger, the clamp jaws, the cover and base housings may be any material selected from the group comprising metals, alloys, plastic, rubber, or a combination thereof.

14. A novel clamp meter with rotary mechanism for clamp jaws comprising a main body that is made up of:
  a) a cover housing and a base housing, the two housings enclosing a measurement circuitry of the clamp meter;
  b) a display screen, a function selection switch, and a set of push buttons to select testing parameters are housed within said cover and base housings and electrically connected to said measurement circuitry,
  c) two input terminals,
  d) a clamp housing that houses a pair of clamp jaws, each of said clamp jaws containing electrical coils, said coils being electrically connected to said circuitry; said clamp jaws being connected to said clamp housing through an arrangement comprising a through a pin, which is made of metal or any other suitable material selected from a group of materials comprising hard plastic, hard rubber, and wood,
  e) a trigger for opening and closing said clamp jaws, wherein when pressed, said trigger pushes at least one of said jaws,
  f) a compression spring for each of said jaws, wherein said compression springs are so located that said clamp jaws, in their open position, press against said compression springs, and whereby, upon the release of said trigger, said compression springs push said clamp jaws back into their closed position,
  g) a rotary mechanism that allows rotation of said clamp jaws, wherein said rotary mechanism comprises:
    i) a disk or a mechanical rotary bearing or a gear train wherein when a disc is used, said disc is either provided integrally with the clamp housing or manufactured separately and attached fixedly to said clamp housing by any means of attachment selected from a group comprising screwing, gluing, heating and pressurising, welding, and any combination thereof, and wherein a periphery of the disk is so shaped that it forms alternate protrusions and grooves in a plane of the disk, each of said protrusions having a hump, wherein said disk is made from any electrically non conducting material selected from a group of materials comprising hard or semi-hard materials,
    ii) ball and catch arrangements, at least one in number, that are provided peripherally on the disk, wherein each ball is provided with a locking spring such that said ball is secured in a groove when not under application of a rotational force while turning said pair of clamp jaws.

\* \* \* \* \*